United States Patent
Jiang et al.

(10) Patent No.: US 11,200,819 B2
(45) Date of Patent: Dec. 14, 2021

(54) DISPLAY SUBSTRATE AND MANUFACTURING METHOD THEREOF, DISPLAY PANEL, DISPLAY MOTHERBOARD AND TESTING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xue Jiang, Beijing (CN); Jing Wang, Beijing (CN); Wei He, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/760,366

(22) PCT Filed: Jan. 7, 2019

(86) PCT No.: PCT/CN2019/070653
§ 371 (c)(1),
(2) Date: Apr. 29, 2020

(87) PCT Pub. No.: WO2019/179218
PCT Pub. Date: Sep. 26, 2019

(65) Prior Publication Data
US 2021/0183282 A1 Jun. 17, 2021

(30) Foreign Application Priority Data
Mar. 23, 2018 (CN) .......................... 201810244800.6

(51) Int. Cl.
*G09G 3/00* (2006.01)
*G06F 1/18* (2006.01)
(Continued)

(52) U.S. Cl.
CPC ............. *G09G 3/006* (2013.01); *G06F 1/184* (2013.01); *G09G 3/3291* (2013.01); *H01L 27/3276* (2013.01); *H01L 2227/323* (2013.01)

(58) Field of Classification Search
CPC ... G09G 3/006; G09G 3/3291; H01L 27/3276
See application file for complete search history.

(56) References Cited

U.S. PATENT DOCUMENTS 7,605,599 B2 * 10/2009 Kwak .................... G09G 3/006
324/760.01
2003/0146694 A1 * 8/2003 Lee ..................... H01L 27/3288
313/505
(Continued)

FOREIGN PATENT DOCUMENTS

CN        1452146 A    10/2003
CN     101315508 A    12/2008
(Continued)

*Primary Examiner* — Sardis F Azongha
(74) *Attorney, Agent, or Firm* — Nath, Goldberg & Meyer; Joshua B. Goldberg

(57) ABSTRACT

A display substrate and a manufacturing method thereof, a display panel, a display motherboard and a testing method thereof, and a display device are provided in the present disclosure. The display substrate is provided with a display region and at least a wiring region outside the display region. The display substrate includes a base substrate and a plurality of connection structures on the base substrate. The plurality of connection structures are connected to a plurality of edge signal terminals through a control module. All of the plurality of connection structures, the plurality of edge signal terminals and the control module are located in the wiring region. The plurality of edge signal terminals are
(Continued)

located on an edge of the wiring region. The control circuit is configured to control the connection or disconnection between the plurality of signal terminals and the plurality of connection structures.

17 Claims, 11 Drawing Sheets

(51) Int. Cl.
*H01L 27/32* (2006.01)
*G09G 3/3291* (2016.01)

(56) References Cited

U.S. PATENT DOCUMENTS

| | | | | |
|---|---|---|---|---|
| 2008/0251787 | A1* | 10/2008 | Kim | H01L 22/32 |
| | | | | 257/48 |
| 2008/0303755 | A1* | 12/2008 | Oh | H01L 27/3288 |
| | | | | 345/76 |

FOREIGN PATENT DOCUMENTS

| CN | 102967954 | A | | 3/2013 |
|---|---|---|---|---|
| CN | 103268744 | A * | | 8/2013 |
| CN | 105096781 | A | | 11/2015 |
| CN | 108257541 | A | | 7/2018 |
| CN | 207895832 | U | | 9/2018 |
| KR | 20150062356 | A | | 6/2015 |

* cited by examiner

DISPLAY SUBSTRATE AND MANUFACTURING METHOD THEREOF, DISPLAY PANEL, DISPLAY MOTHERBOARD AND TESTING METHOD THEREOF, AND DISPLAY DEVICE

CROSS-REFERENCE TO RELATED APPLICATIONS

This is a National Phase Application filed under 35 U.S.C. 371 as a national stage of PCT/CN2019/070653, filed Jan. 7, 2019, an application claiming the benefit of Chinese Application No. 201810244800.6, filed Mar. 23, 2018, the content of each of which is hereby incorporated by reference in its entirety.

TECHNICAL FIELD

The present disclosure relates to the field of display technology, and in particular relates to a display substrate and a manufacturing method for manufacturing the same, a display panel, a display motherboard and a testing method thereof, and a display device.

BACKGROUND

During a process for manufacturing a display panel, a display motherboard is tested by a test circuit (array test) after the display motherboard is manufactured. After the test is finished, the display motherboard is cut into a plurality of display panels along a cutting line.

SUMMARY

According to an aspect of the present disclosure, a display substrate is provided. The display substrate provided with a display region and at least a wiring region outside the display region. The display substrate includes a base substrate; a plurality of connection structures on the base substrate and in the wiring region; a plurality of signal terminals on the base substrate and on an edge of the wiring region; a control circuit coupled between the plurality of connection structures and the plurality of signal terminals, disposed in the wiring region, and configured to control connection or disconnection between the plurality of signal terminals and the plurality of connection structures.

In an embodiment, the control circuit includes a plurality of first control circuits and a plurality of second control circuits. Each of the plurality of first control circuits and the plurality of second control circuits is connected to a corresponding signal terminal and a corresponding connection structure respectively.

In an embodiment, each of the plurality of first control circuits is configured to receive a control signal from a signal terminal connected with the first control circuit during a test stage, and each of the plurality of second control circuits is configured to receive a data voltage signal from a signal terminal connected with the second control circuit during the test stage.

In an embodiment, each of the plurality of first control circuits includes a first switch transistor and a second switch transistor which have different types from each other. A control electrode and a first electrode of the first switch transistor are coupled to a control electrode and a first electrode of the second switch transistor and are coupled to a signal terminal coupled to a control circuit in which the first switch transistor and the second switch transistor are located. A second electrode of the first switch transistor is coupled to a second electrode of the second switch transistor and is coupled to a connection structure coupled to the control circuit in which the first switch transistor and the second switch transistor are located.

In an embodiment, at least one of the plurality of second control circuits includes a first switch transistor and a second switch transistor which have different types from each other. A control electrode and a first electrode of the first switch transistor are coupled to a control electrode and a first electrode of the second switch transistor and are coupled to a signal terminal coupled to a control circuit in which the first switch transistor and the second switch transistor are located. A second electrode of the first switch transistor is coupled to a second electrode of the second switch transistor and is coupled to a connection structure coupled to the control circuit in which the first switch transistor and the second switch transistor are located.

In an embodiment, at least one of the plurality of second control circuits includes a third switch transistor. A control electrode and a first electrode of the third switch transistor are coupled together and are coupled to a signal terminal coupled to a control circuit in which the third switch transistor is located. A second electrode of the third switch transistor is coupled to a connection structure coupled to the control circuit in which the third switch transistor is located.

In an embodiment, at least one of the plurality of second control circuits includes a fourth switch transistor, a fifth switch transistor, a sixth switch transistor and a seventh switch transistor. A control electrode and a first electrode of the fourth switch transistor are coupled to a control electrode of the fifth switch transistor and are coupled to a signal terminal coupled to a control circuit in which the fourth switch transistor and the fifth switch transistor are located. A second electrode of the fourth switch transistor and a second electrode of the seventh switch transistor are coupled together and are coupled to a connection structure coupled to the control circuit in which the fourth switch transistor and the seventh switch transistor are located. A first electrode of the fifth switch transistor is coupled to a first power supply terminal, and a second electrode of the fifth switch transistor is coupled to a first electrode of the sixth switch transistor and a control electrode of the seventh switch transistor respectively. A control electrode and a second electrode of the sixth switch transistor are coupled together to a second power supply terminal. A first electrode of the seventh switch transistor is coupled to the first power supply terminal.

In an embodiment, each of the plurality of first control circuits includes a fourth switch transistor, a fifth switch transistor, a sixth switch transistor and a seventh switch transistor. A control electrode and a first electrode of the fourth switch transistor are coupled to a control electrode of the fifth switch transistor and are coupled to a signal terminal coupled to a control circuit in which the fourth switch transistor and the fifth switch transistor are located. A second electrode of the fourth switch transistor and a second electrode of the seventh switch transistor are coupled together and are coupled to a connection structure coupled to the control circuit in which the fourth switch transistor and the seventh switch transistor are located. A first electrode of the fifth switch transistor is coupled to a first power supply terminal, and a second electrode of the fifth switch transistor is coupled to a first electrode of the sixth switch transistor and a control electrode of the seventh switch transistor respectively. A control electrode and a second electrode of the sixth switch transistor are coupled together to a second power supply terminal. A first electrode of the seventh switch transistor is coupled to the first power supply terminal.

In an embodiment, at least one of the plurality of second control circuits includes a first switch transistor and a second switch transistor which have different types from each other. A control electrode and a first electrode of the first switch transistor are coupled to a control electrode and a first electrode of the second switch transistor and are coupled to a signal terminal coupled to a control circuit in which the first switch transistor and the second switch transistor are located. A second electrode of the first switch transistor is coupled to a second electrode of the second switch transistor and is coupled to a connection structure coupled to the control circuit in which the first switch transistor and the second switch transistor are located.

In an embodiment, at least one of the plurality of second control circuits includes a third switch transistor. A control electrode and a first electrode of the third switch transistor are coupled together and are coupled to a signal terminal coupled to a control circuit in which the third switch transistor is located. A second electrode of the third switch transistor is coupled to a connection structure coupled to the control circuit in which the third switch transistor is located.

In an embodiment, at least one of the plurality of second control circuits includes a fourth switch transistor, a fifth switch transistor, a sixth switch transistor and a seventh switch transistor. A control electrode and a first electrode of the fourth switch transistor are coupled to a control electrode of the fifth switch transistor and are coupled to a signal terminal coupled to a control circuit in which the fourth switch transistor and the fifth switch transistor are located. A second electrode of the fourth switch transistor and a second electrode of the seventh switch transistor are coupled together and coupled to a connection structure coupled to the control circuit in which the fourth switch transistor and the seventh switch transistor are located. A first electrode of the fifth switch transistor is coupled to a first power supply terminal, and a second electrode of the fifth switch transistor is coupled to a first electrode of the sixth switch transistor and a control electrode of the seventh switch transistor respectively. A control electrode and a second electrode of the sixth switch transistor are coupled together to a second power supply terminal. A first electrode of the seventh switch transistor is coupled to the first power supply terminal.

In an embodiment, each of the plurality of connection structures is a pad.

In an embodiment, the display substrate includes one wiring region on one edge of the display substrate outside the display region.

According to an aspect of the present disclosure, a display panel including a counter substrate and the above display substrate disposed opposite to each other is provided.

In an embodiment, the display panel includes a liquid crystal display panel or an AMOLED display panel.

According to an aspect of the disclosure, a display device including the above display panel is provided.

According to an aspect of the disclosure, a display motherboard including a plurality of display substrates arranged in an array as described above. The signal terminals of each of the display substrates are connected to corresponding test signal input lines respectively.

According to an aspect of the disclosure, a method for testing the display motherboard is provided. The method includes: the control circuit in each of the display substrates is turned on when the display motherboard is tested, so that a plurality of test signals output from the plurality of signal terminals are respectively output to the plurality of connection structures; and the control circuit in each of the display substrates is turned off after the test is finished, so that all of the plurality of connection structures are disconnected from the plurality of signal terminals.

According to an aspect of the disclosure, a method for manufacturing a display substrate is provided. The method includes: forming a display region and at least a wiring region outside the display region on a base substrate; forming a plurality of connection structures in the wiring region of the base substrate; forming a plurality of signal terminals in the wiring region of the base substrate and on an edge of the base substrate; and forming a control circuit coupled between the plurality of connection structures and the plurality of signal terminals in the wiring region of the base substrate, wherein the control circuit controls connection or disconnection between the plurality of signal terminals and the plurality of connection structures.

BRIEF DESCRIPTION OF THE DRAWINGS

FIG. 4b is an enlarged view of the first control circuit in FIG. 4a;

FIG. 5b is an enlarged view showing the first control circuit in FIG. 5a;

DETAILED DESCRIPTION

Figure 1A:
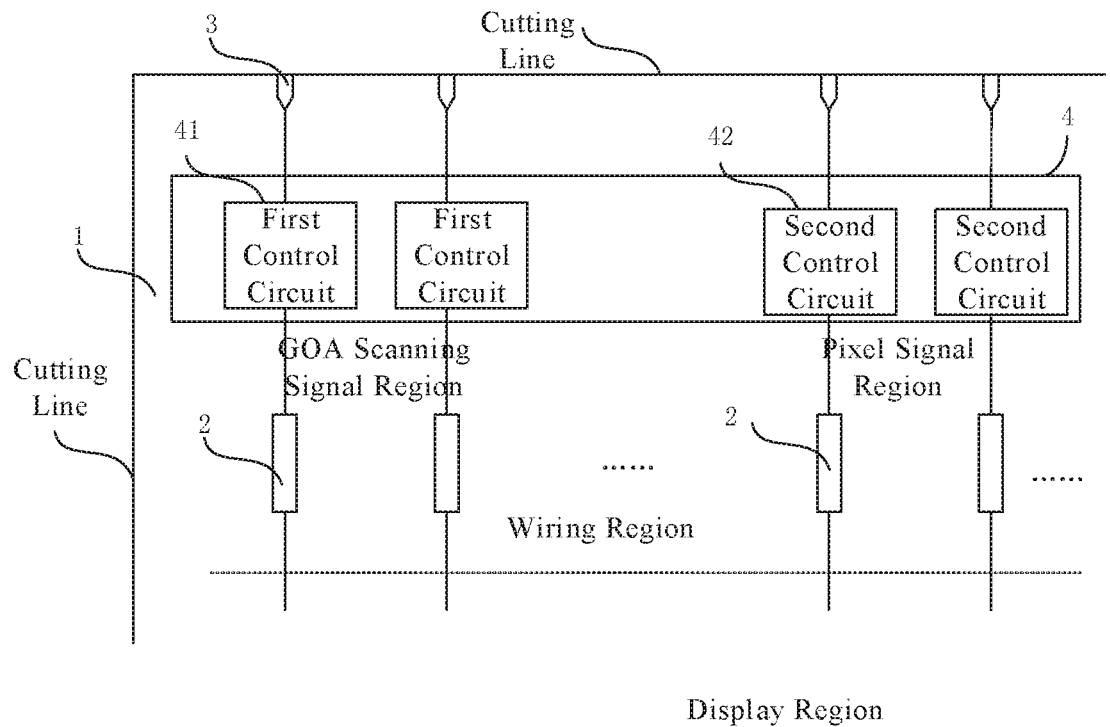
FIG. 1a is a schematic diagram showing a structure of a display substrate according to an embodiment of the present disclosure.

To enable one of ordinary skill in the art to better understand the technical solutions of the present disclosure, a display substrate, a display panel, and a display device provided by the present disclosure will be further described in detail below with reference to the accompanying drawings. The same reference numerals in the specification represent the same elements.

Conductive residues exist at a cross section of an edge where a cutting line is located, thereby resulting in a short circuit at the edge where the cutting line is located and a poor display phenomena of the display device during display, such as abnormal display or poor wiring.

FIG. 1a is a schematic diagram showing a structure of a display substrate according to an embodiment of the present disclosure. As shown in FIG. 1a, a display region and a wiring region outside the display region are disposed on the display substrate. The display substrate includes a base substrate 1, and a plurality of connection structures 2 located on the base substrate 1 and disposed in the wiring region. A plurality of signal terminals 3 are disposed on the base substrate 1 and on an edge of the wiring region. A control circuit 4 is coupled between the plurality of connection structures and the plurality of signal terminals and is disposed in the wiring region. The control circuit may control the plurality of signal terminals to electrically connected with the plurality of connection structures during a test stage, so that a plurality of test signals output from the plurality of signal terminals are output to the connection structures, and the control circuit may also control the plurality of signal terminals to disconnected from the plurality of connection structures during a display stage.

The wiring region is divided into a GOA (Gate Driver on array) scanning signal region and a pixel signal region. In an embodiment, the control circuit 4 may include a plurality of first control circuits 41 in the GOA scanning signal region and a plurality of second control circuits 42 in the pixel signal region. In the GOA scanning signal region, one of the connection structures 2 is coupled to a corresponding edge signal terminal 3 through the first control circuit 41; and in the pixel signal region, one of the connection structures 2 is coupled to a corresponding edge signal terminal 3 through the second control circuit 42. All of the plurality of connection structures 2, the plurality of edge signal terminals 3, the plurality of first control circuits 41, and the plurality of second control circuits 42 are located in the wiring region. The plurality of edge signal terminals 3 are located on one edge of the wiring region. All of the plurality of first control circuits 41 and the plurality of second control circuits 42 are turned on during the test stage, so that the test signals output by the plurality of edge signal terminals 3 are respectively output to the connection structures 2; and all of the plurality of first control circuits 41 and the plurality of second control circuits 42 are turned off during the display stage, so that all of the plurality of connection structures 2 are disconnected from the plurality of edge signal terminals 3.

In the embodiment, the display motherboard is tested after the display motherboard is manufactured. After the test is finished, the display motherboard may be cut into a plurality of display panels. Each of the display panels includes a display substrate and a counter substrate which are oppositely arranged and aligned. The drawings of the present disclosure show only the display substrate of one display panel.

Figure 1B:
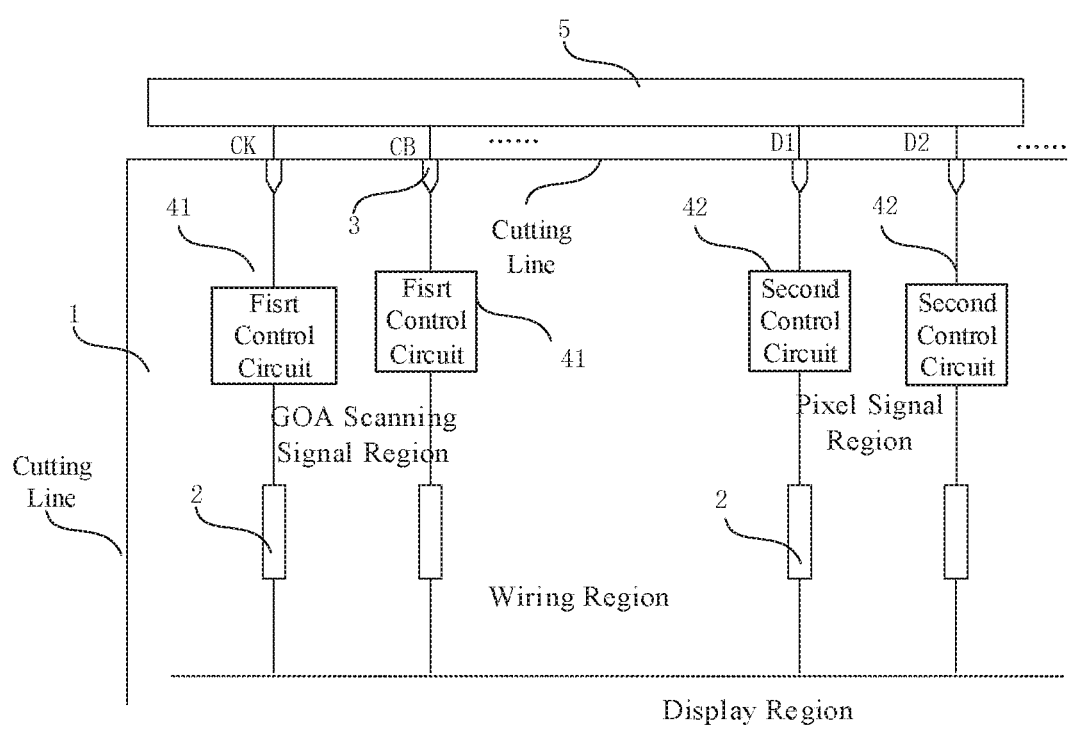
FIG. 1b is a schematic diagram showing a display substrate during a test stage according to an embodiment of the present disclosure.

FIG. 1b is a schematic diagram showing a display substrate during a test stage according to an embodiment of the present disclosure. As shown in FIG. 1b, a test circuit 5 is configured to test the display motherboard during the test stage before the display motherboard is cut. As shown in FIG. 1b, during the test stage, the plurality of edge signal terminals 3 of the display substrate are respectively coupled to the test circuit 5. During the test stage, each of the connection structures 2 receives a corresponding one of the plurality of test signals output from the test circuit 5, so that the display motherboard displays a picture according to the plurality of test signals. The plurality of test signals may include a plurality of control signals CK, CB, etc. and a plurality of data voltage signals D1, D2, etc. FIG. 1b illustrates an example in which the display substrate has four connection structures 2, for example, from left to right, in the GOA scanning signal region, one of the plurality of first control circuits 41 receives a timing control signal, i.e., a clock (CK) signal, output from the test circuit 5, and the other of the plurality of first control circuits 41 receives a control bus (CB) signal output from the test circuit 5. In the pixel signal region, one of the plurality of second control circuits 42 receives a data voltage signal D1 output from the test circuit 5, and the other of the plurality of second control circuits 42 receives a data voltage signal D2 output from the test circuit. When all of the plurality of first control circuits 41 and the plurality of second control circuits 42 are turned on, the test circuit 5 respectively outputs the plurality of test signals including the CK signal, the CB signal, and the data voltage signals D1, D2 to the plurality of connection structures 2 through the plurality of edge signal terminals 3 and the plurality of first control circuits 41 and the plurality of second control circuits 42 that are turned on, so as to test the display substrate.

Figure 1C:
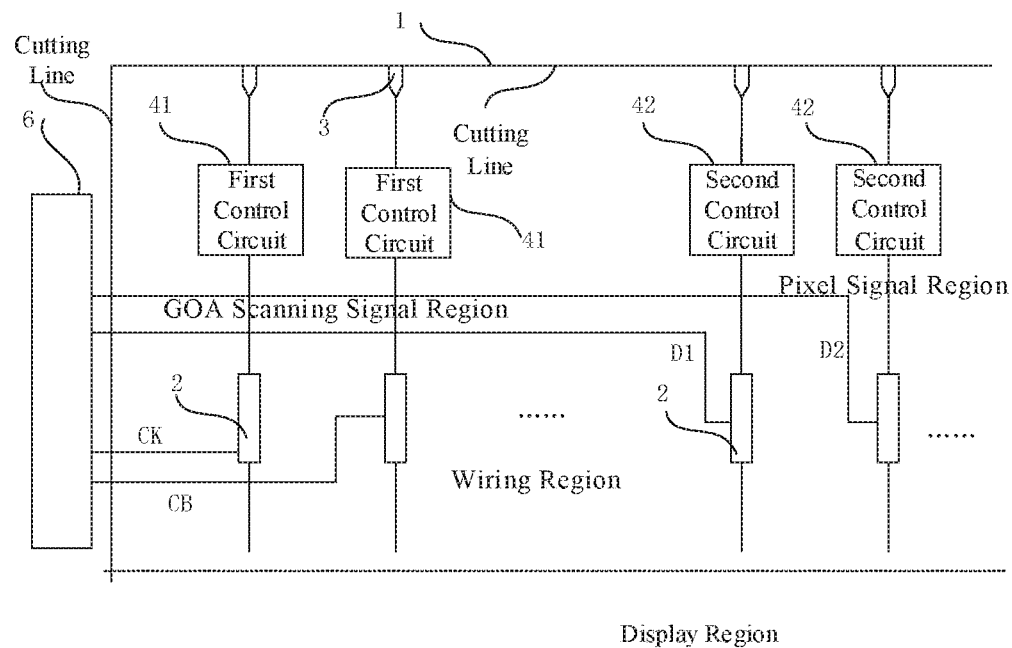
FIG. 1c is a schematic diagram showing a display substrate during a display stage according to an embodiment of the present disclosure.

FIG. 1c is a schematic diagram showing a display substrate during a display stage according to an embodiment of the present disclosure. As shown in FIG. 1c, after the display motherboard is cut into the display panels, the display panel can perform image display. During the display stage, a driving circuit 6 is coupled to each of the plurality of connection structures 2. During the display stage, each of the connection structure 2 receives a corresponding one of display signals output from the driving circuit 6, so that the display substrate displays a picture according to the display signals. The display signals may include the CK signal, the CB signal, etc. and the data voltage signals D1, D2, etc. as described above.

It should be noted that since the plurality of control signals may include control signals in pair such as CK signals, CB signals, etc., the connection structures 2 for receiving the plurality of control signals may be disposed in pairs (e.g., 2, 4 or 6 connection structures, etc.) in the GOA scanning signal region. FIGS. 1a, 1b, and 1c only show an example in which two connection structures 2 is used for receiving CK signals, CB signals. Since the plurality of data voltage signals may include the data voltage signals D1, D2, and so on, a plurality of connection structures 2 can be provided for receiving the data voltage signals. FIGS. 1a, 1b, and 1c show only an example in which two connection structures 2 is used for receiving the data voltage signals D1 and D2.

As shown in FIG. 1c, during the display stage, the display substrate is disconnected from the test circuit 5, so that no test signal is output from the edge signal terminal 3, that is, all of the edge signal terminals 3 are in a floating state. At this time, since all of the plurality of first control circuits 41 and the plurality of second control circuits 42 are turned off, all of the plurality of edge signal terminals 3 are disconnected from the plurality of connection structures 2, respectively. Therefore, the display signal loaded on each of the connection structures 2 cannot flow back to the corresponding edge signal terminal 3. In this case, even if some of the edge signal terminals 3 are short-circuited due to conductive residues at the cutting line, the display signals loaded on the connection structures 2 corresponding to some of the edge signal terminals 3 cannot be affected. In other words, the display signals cannot be affected by the conductive residues during the display stage.

In an embodiment, each of the plurality of connection structures 2 is, for example, a pad (bump).

In the embodiment, the display substrate is provided with one wiring region, as shown in FIGS. 1a to 1c, and the wiring region may be disposed on one edge of the display substrate outside the display region.

Figure 2A:
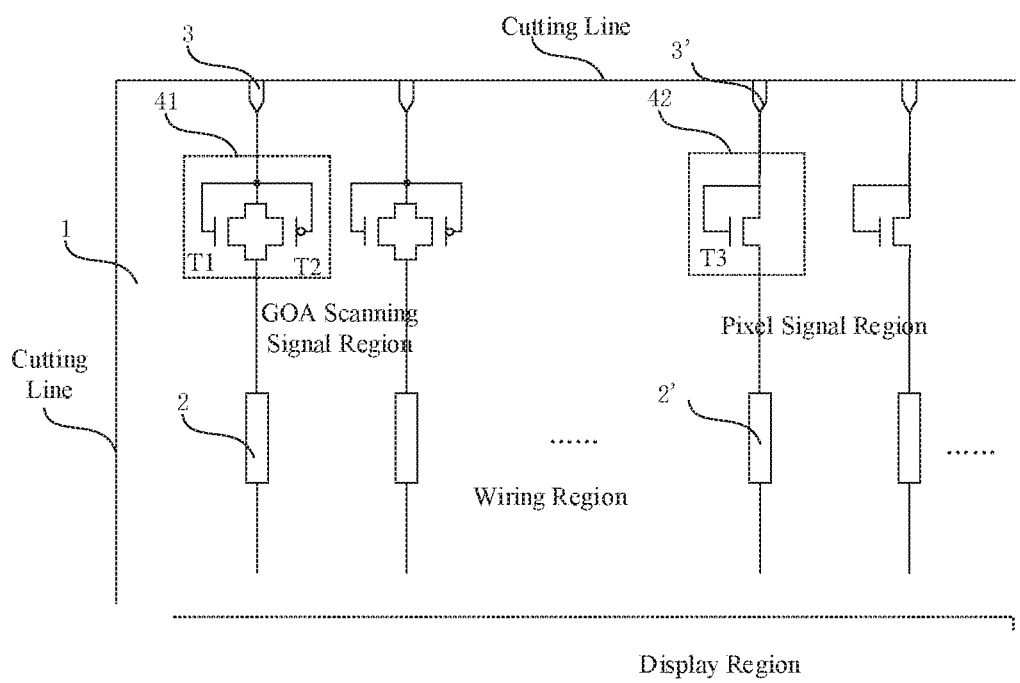
FIG. 2a is a schematic diagram showing a structure of a display substrate according to an embodiment of the present disclosure.

FIG. 2a is a schematic diagram showing a structure of a display substrate according to an embodiment of the present disclosure. As shown in FIG. 2a, the plurality of first control circuits 41 in the GOA scanning signal regions have the same structures. Each of the plurality of first control circuits 41 includes a first switch transistor T1 and a second switch transistor T2 which have different types from each other. The first switch transistor T1 is an N-type MOS transistor, and the second switch transistor T2 is a P-type MOS transistor. A control electrode and a first electrode of the first switch transistor T1 are coupled together and coupled to an edge signal terminal 3 coupled to the first control circuit 41 in which the first switch transistor T1 is located, and a second electrode of the first switch transistor T1 is coupled to a connection structure 2 coupled to the first control circuit 41 in which the first switch transistor T1 is located. A control electrode and a first electrode of the second switch transistor T2 are coupled to the control electrode and the first electrode of the first switch transistor T1 and to the edge signal terminal 3 coupled to the first control circuit 41 in which the first switch transistor T1 and the second switch transistor T2 are located, and a second electrode of the second switch transistor T2 is coupled to the second electrode of the first switch transistor T1 and to the connection structure 2 coupled to the first control circuit 41 in which the first switch transistor T1 and the second switch transistor T2 are located.

The plurality of second control circuits 42 in the pixel signal region have the same structures, but the structure of the second control circuits 42 is different from that of the first control circuits 41. Specifically, each of the plurality of second control circuits 42 includes a third switch transistor T3. A control electrode and a first electrode of the third switch transistor T3 are coupled together and coupled to an edge signal terminal 3' coupled to the control circuit 42 in which the third switch transistor T3 is located, and a second electrode of the third switch transistor T3 is coupled to a connection structure 2' coupled to the control circuit 42 in which the third switch transistor T3 is located. The third switch transistor T3 is an N-type MOS transistor.

Figure 2B:
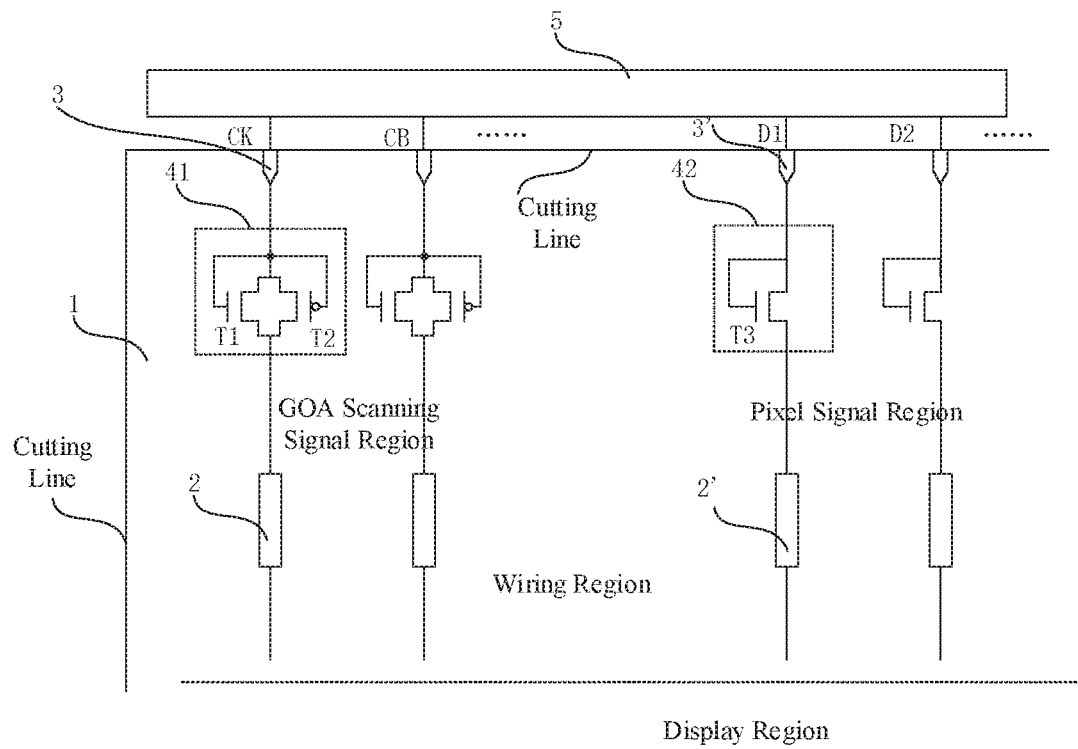
FIG. 2b is a schematic diagram showing a display substrate during a test stage according to an embodiment of the present disclosure.

FIG. 2b is a schematic diagram showing a display substrate during a test stage according to an embodiment of the present disclosure. During the test stage, the plurality of edge signal terminals 3 in the display substrate are respectively coupled to the test circuit 5. During the test stage, each of the connection structures 2 receives a corresponding one of a plurality of test signals including a CK signal, a CB signal, and data voltage signals output from the external test circuit 5 to cause the display substrate to display a picture according to the test signals. For example, in the GOA scanning signal region, one of the plurality of first control circuits 41 receives the CK signal output from the test circuit 5, and the other of the plurality of first control circuits 41 receives the CB signal output from the test circuit 5. In the pixel signal region, one of the plurality of second control circuits 42 receives the data voltage signal D1 output from the test circuit 5, and the other of the plurality of second control circuits 42 receives the data voltage signal D2 output from the test circuit. During the test stage, when both of the CK signal and the CB signal have a high level, the first switch transistor T1 is turned on, and the second switch transistor T2 is turned off; when both of the CK signal and the CB signal have a low level, the first switch transistor T1 is turned off, and the second switch transistor T2 is turned on. When both of the data voltage signals D1 and D2 have a high level, the third switch transistor T3 is turned on. Accordingly, the test circuit 5 respectively outputs the plurality of test signals including the CK signal, the CB signal, and the data voltage signals D1 and D2 to the plurality of connection structures 2 through the plurality of edge signal terminals 3 and the plurality of first control circuits 41 and the plurality of second control circuits 42 that are turned on, so as to test the display motherboard.

Figure 2C:
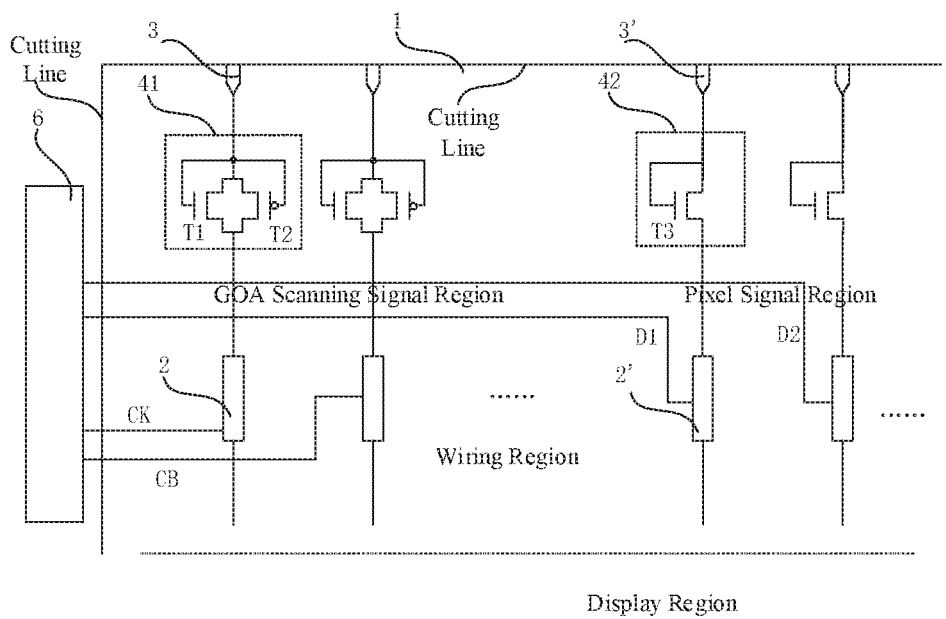
FIG. 2c is a schematic diagram showing a display substrate during a display stage according to an embodiment of the present disclosure.

FIG. 2c is a schematic diagram showing the display substrate during a display stage according to the embodiment of the present disclosure. As shown in FIG. 2c, during the display stage, the driving circuit 6 outside the display substrate is respectively coupled to the plurality of connection structures 2. The connection structures 2 in the GOA scanning signal region respectively receive the plurality of control signals CK and CB output from the driving circuit 6, and the connection structures 2 in the pixel signal region respectively receive the plurality of data voltage signals D1 and D2 output from the driving circuit 6, so that the display panel displays a picture according to the plurality of control signals CK, CB and the plurality of data voltage signals D1, D2.

During the display stage, since the display substrate is disconnected from the test circuit 5, no signal is output from the edge signal terminals 3, that is, each of the edge signal terminals 3 is in a floating state. At this time, all of the first switch transistor T1, the second switch transistor T2, and the third switch transistor T3 are turned off, that is, all of the plurality of first control circuits 41 and the plurality of second control circuits 42 are turned off, so that the plurality of edge signal terminals 3 are disconnected from the plurality of connection structures 2 respectively. Therefore, the display signal loaded on each of the connection structures 2 cannot flow back to the corresponding edge signal terminal 3, and therefore, even if some of the edge signal terminals 3 are short-circuited due to conductive residues at the cutting line, the display signals loaded on the connection structures 2 corresponding to some of the edge signal terminals 3 cannot be affected. In other words, the display signal loaded on each of the connection structures 2 cannot be affected by the conductive residues during the display stage, so that the display device is prevented from poor display. In the embodiment, it is unnecessary to remove the conductive residues by wiping, so as to prevent the connection structure from being scratched, and thus avoiding poor quality products and risk of reliability. In the embodiment, it is unnecessary to clean the conductive residues at the cross section by plasma cleaning, so as to decrease the cleaning difficulty and improve the product yield.

In an embodiment, each of the plurality of connection structures 2 is, for example, a pad.

In the embodiment, the display substrate is provided with one wiring region, as shown in FIGS. 2a, 2b, and 2c, and the wiring region may be disposed on one edge of the display substrate outside the display region.

As shown in FIGS. 2a, 2b, 2c, each of the first control circuits 41 includes an NMOS transistor and a PMOS transistor, and each of the second control circuits 42 includes only an NMOS transistor. According to the structures of the first control circuit 41 and the second control circuit 42, the display panel having the display substrate may be an AMOLED display panel or a liquid crystal display panel driven by a positive bias, because the AMOLED display panel or the liquid crystal display panel driven by the positive bias is driven by a positive voltage. In the case that the display panel is an AMOLED display panel, the display substrate may be an AMOLED display substrate; in the case where the display panel is the liquid crystal display panel driven by the positive bias, the display substrate may be an array substrate.

Figure 3A:
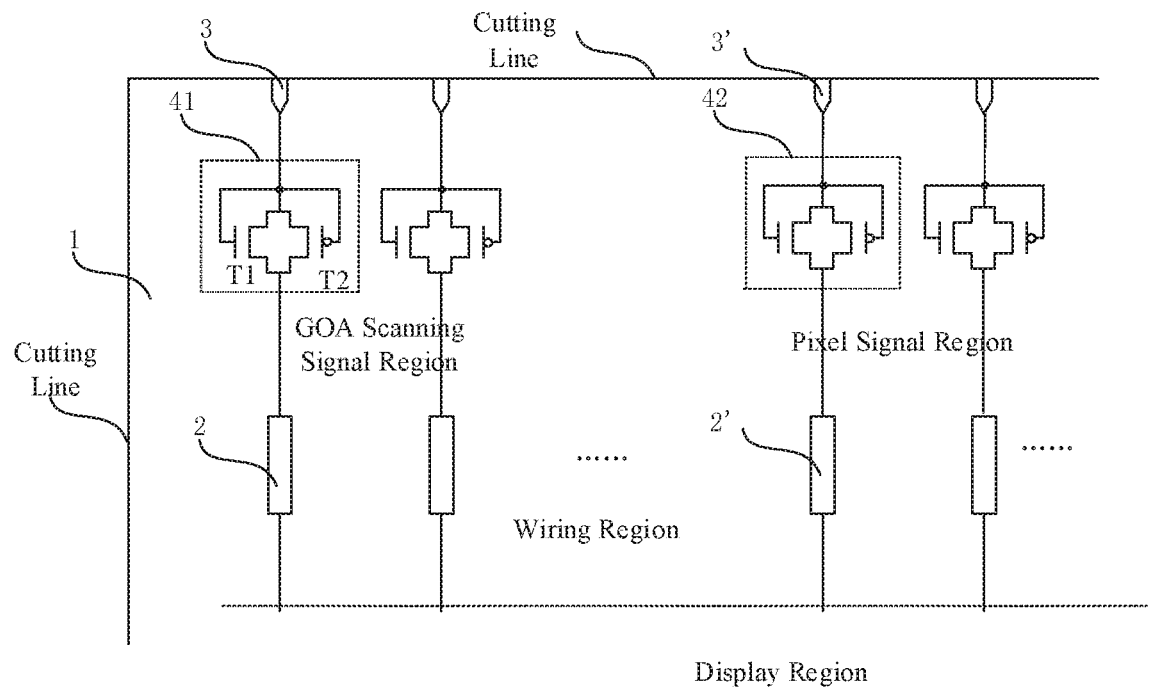
FIG. 3a is a schematic diagram showing a structure of a display substrate according to an embodiment of the present disclosure.
Figure 3B:
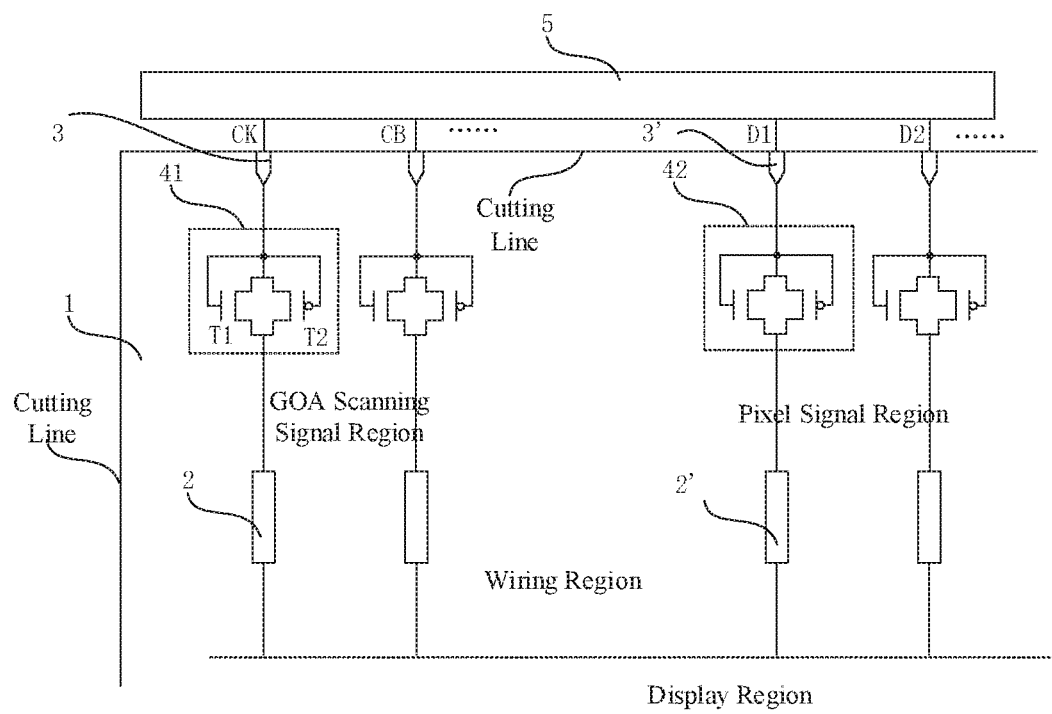
FIG. 3b is a schematic diagram showing a display substrate during a test stage according to an embodiment of the present disclosure.
Figure 3C:
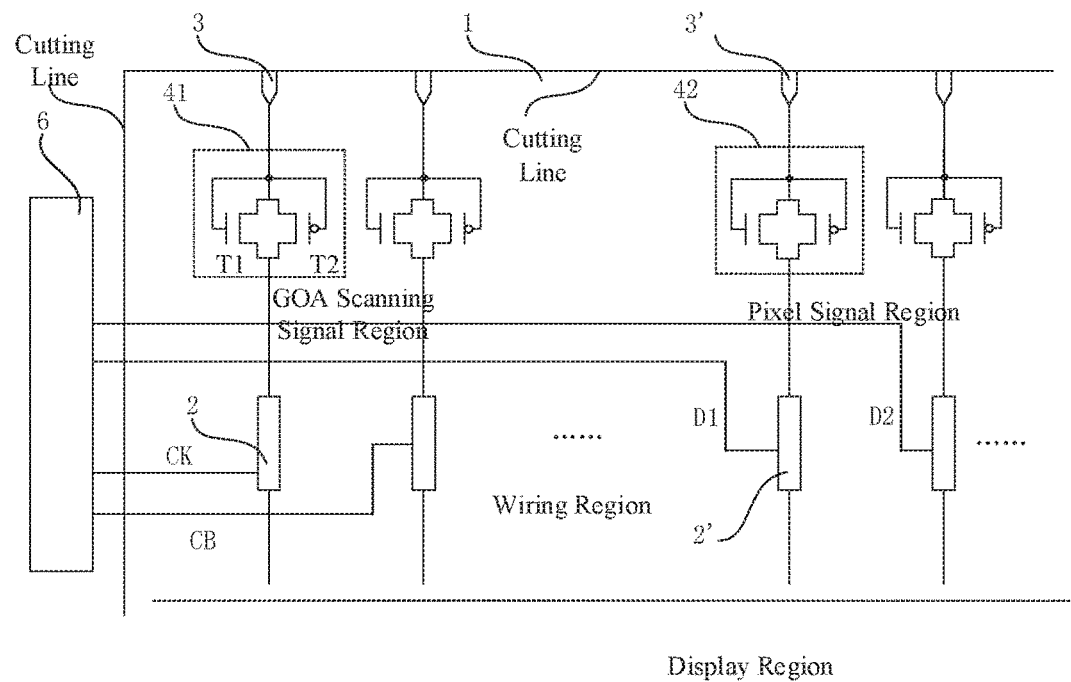
FIG. 3c is a schematic diagram showing a display substrate during a display stage according to an embodiment of the present disclosure.

FIG. 3a is a schematic diagram showing a structure of a display substrate according to an embodiment of the present disclosure. FIG. 3b is a schematic diagram showing a display substrate during a test stage according to an embodiment of the present disclosure. FIG. 3c is a schematic diagram showing the display substrate during the display stage according to the embodiment of the present disclosure. As shown in FIGS. 3a, 3b and 3c, all of the plurality of first control circuits 41 in the GOA scanning signal region and the plurality of second control circuits 42 in the pixel signal region have the same structure. Specifically, each of the control circuits includes a first switch transistor T1 and a second switch transistor T2. The first switch transistor T1 is an N-type MOS transistor, and the second switch transistor T2 is a P-type MOS transistor. Therefore, during the test stage, the plurality of control circuits 41 for receiving the CK signal and the CB signal in the GOA scanning signal region can be turned on, and the plurality of control circuits 42 for receiving the data voltage signals D1, D2 in the pixel signal region can be turned on, regardless that whether the CK signal, the CB signal or the data voltage signals is a high-level signal or a low-level signal. The high-level signal may be a positive voltage signal, and the low-level signal may be a negative voltage signal.

According to the display substrate of the embodiment of the present disclosure, each of the plurality of connection structures is coupled to a corresponding edge signal terminal through one control circuit, and the edge signal terminals are located on an edge of the wiring region. All of the control circuits 41 and 42 are turned on during the test stage, so that the test signals output from the edge signal terminals are output to the plurality of connection structures, respectively. After the test is finished, all of the control circuits 41 and 42 are turned off, so that the plurality of connection structures are disconnected from the edge signal terminals. When some of the edge signal terminals are short-circuited, the display signal loaded on each of the connection structures corresponding to some of the edge signal terminals cannot be affected, and therefore the display device is prevented from poor display.

The description of other structures such as the edge signal terminal, the connection structure, and the wiring region in the embodiment is the same as that in the foregoing embodiment, and is not repeated herein.

According to the structure of the control circuit of the embodiment, the display panel including the display substrate of the embodiment may be a TFT-LCD display panel, because the TFT-LCD display panel generally has a pixel voltage which is a positive or negative level. In the case where the display panel is a TFT-LCD display panel, the display substrate may be an array substrate.

Figure 4A:
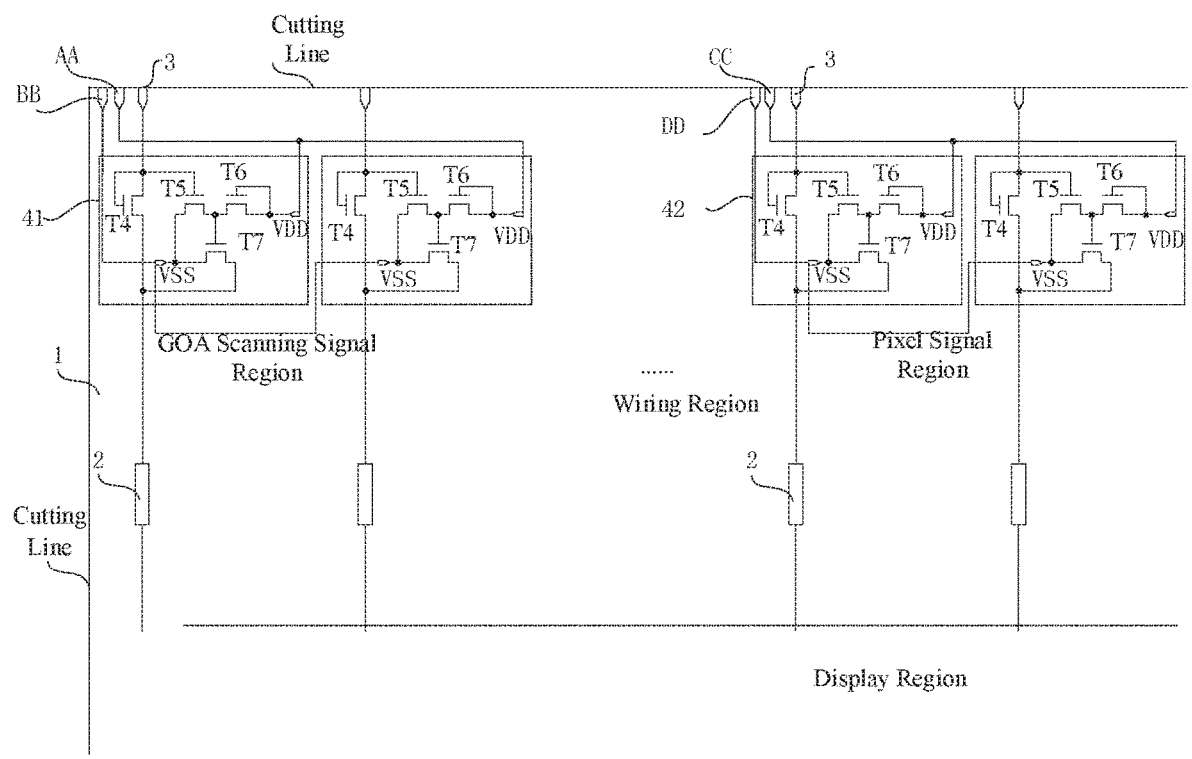
FIG. 4a is a schematic diagram showing a structure of a display substrate according to an embodiment of the present disclosure.
Figure 4B:
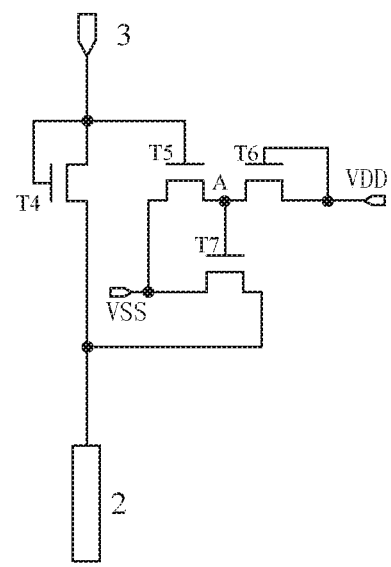
Figure 4C:
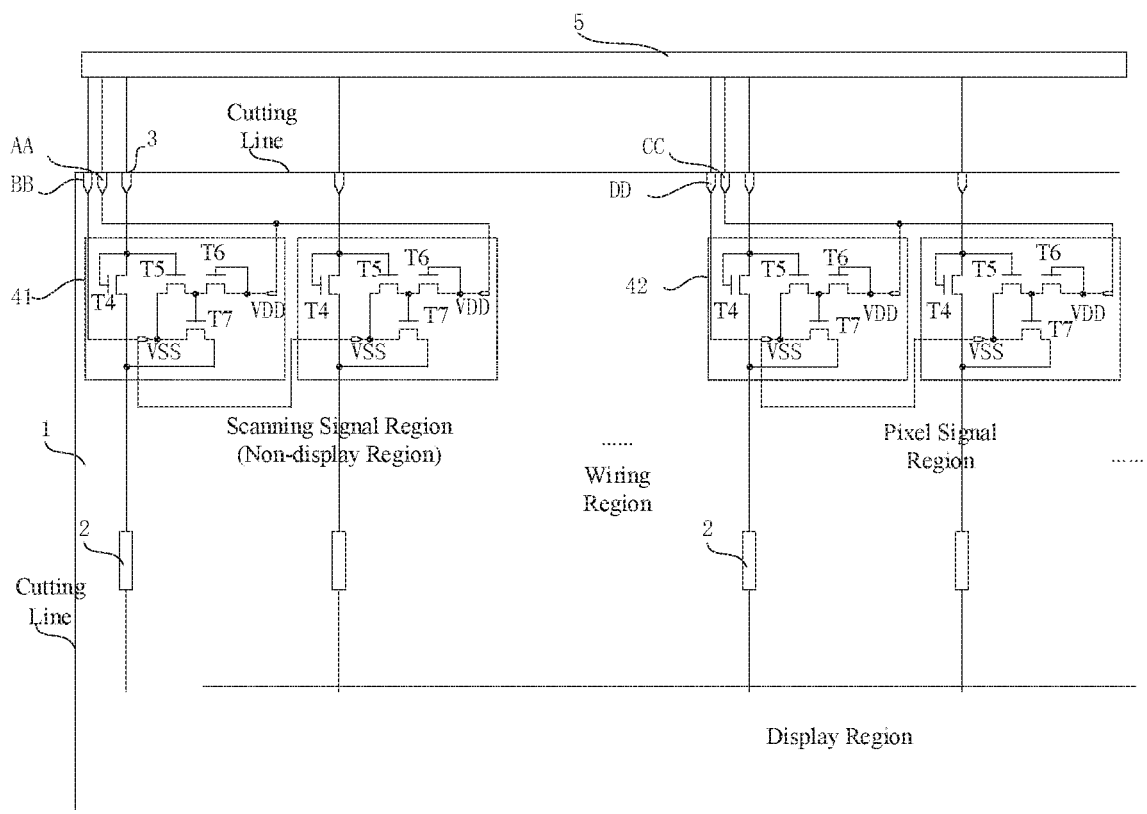
FIG. 4c is a schematic diagram showing a display substrate during a test stage according to an embodiment of the present disclosure.
Figure 4D:
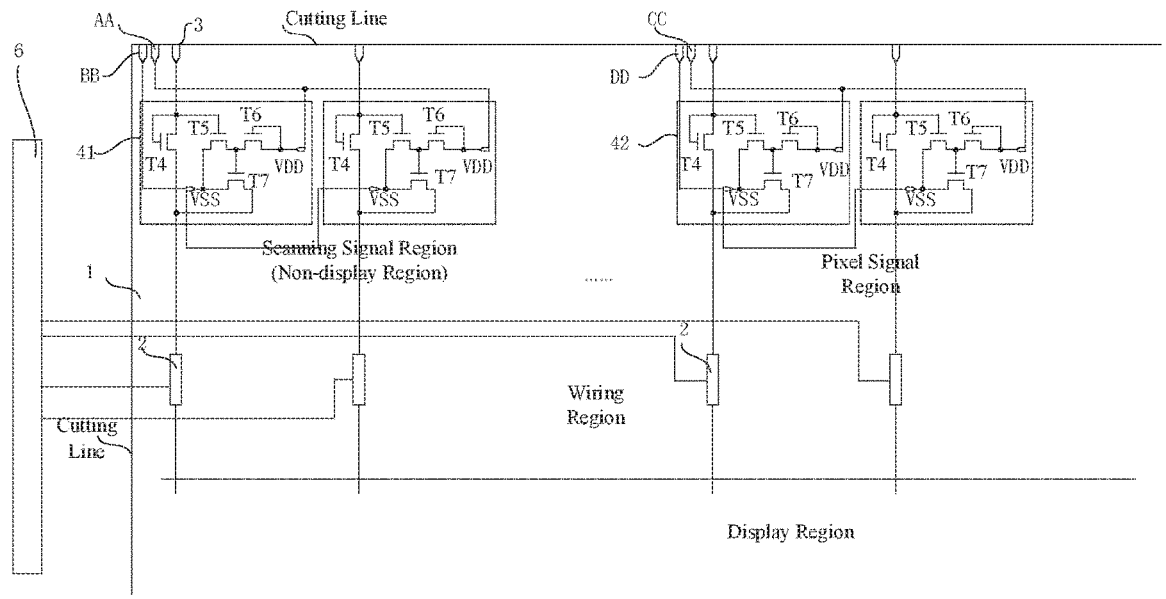
FIG. 4d is a schematic diagram showing a display substrate during a display stage according to an embodiment of the present disclosure.

FIG. 4a is a schematic diagram showing a structure of a display substrate according to an embodiment of the present disclosure. FIG. 4b is an enlarged view of the control circuit in FIG. 4a. FIG. 4c is a schematic diagram showing a display substrate during a test stage according to an embodiment of the present disclosure. FIG. 4d is a schematic diagram showing a display substrate during a display stage according to an embodiment of the present disclosure. As shown in FIGS. 4a, 4b, 4c and 4d, all of the plurality of first control circuits 41 in the GOA scanning signal region and the plurality of second control circuits 42 in the pixel signal region may have the same structure.

Specifically, as shown in FIG. 4b, each of the control circuits may include a fourth switch transistor T4, a fifth switch transistor T5, a sixth switch transistor T6 and a seventh switch transistor T7 all of which are N-type MOS transistors.

A control electrode and a first electrode of fourth switch transistor T4 are coupled to a control electrode of fifth switch transistor T5 and coupled together to an edge signal terminal 3 coupled to the control circuit in which fourth switch transistor T4 and fifth switch transistor T5 are located. A second electrode of fourth switch transistor T4 and a second electrode of seventh switch transistor T7 are coupled together and coupled to a connection structure 2 coupled to the control circuit in which fourth switch transistor T4 and seventh switch transistor T7 are located. A first electrode of the fifth switch transistor T5 is coupled to a low-level voltage VSS, and a second electrode of the fifth switch transistor T5 is coupled to a first electrode of the sixth switch transistor T6 and a control electrode of the seventh switch transistor T7, respectively. A control electrode and a second electrode of the sixth switch transistor T6 are coupled together and coupled to a high-level voltage VDD together. A first electrode of the seventh switch transistor T7 is coupled to the low-level voltage VSS.

When the CK signal, the CB signal, or the data voltage signal having a high level is input to the first edge signal terminal 3, the fourth switch transistor T4 is turned on, the first connection structure 2 receives the high-level signal, and the fifth switch transistor T5 is turned on. The high-level voltage VDD has a high level all the time, and the low-level voltage VSS has a low level all the time. In this case, the sixth switch transistor T6 is turned on, so that a potential at the node A is in a range from 0 to 1. The seventh switch transistor T7 is turned off due to the potential at the node A, and the first connection structure 2 receives a high-level signal.

When the CK signal, the CB signal, or the data voltage signal having the low level is input to the first edge signal terminal 3, the fourth switch transistor T4 is turned off, and the fifth switch transistor T5 is turned off. Since the high-level voltage VDD has a high level, the sixth switch transistor T6 is turned on, the node A has a high level, the seventh switch transistor T7 is turned on, and the low-level voltage VSS is output to the first connection structure 2.

As can be seen from the above analysis, regardless of whether the CK signal, the CB signal, or the data voltage signals are a high-level signal or a low-level signal, the plurality of control circuits 41 for receiving the CK signal and the CB signal in the GOA scanning signal region can be turned on, and the plurality of control circuits 42 for receiving the data voltage signals in the pixel signal region D1, D2 can be turned on.

According to the display substrate of the embodiment of the present disclosure, each of the plurality of connection structures is coupled to a corresponding edge signal terminal through one control circuit, and the edge signal terminals are located on an edge of the wiring region. All of the control circuits 41 and 42 are turned on during the test stage, so that the test signals output from the edge signal terminals are output to the plurality of connection structures, respectively. After the test is completed, all of the plurality of the control circuits 41 and 42 are turned off, so that the connection structures are disconnected from the corresponding edge signal terminals. When some of the edge signal terminals are short-circuited, display signals loaded on the connection structures corresponding to some of the edge signal terminals cannot be affected, and therefore the display device is prevented from poor display.

According to the embodiment, during the test stage as shown in FIG. 4c, in addition to the CK signal, the CB signal, and the data voltage signals D1 and D2, the test circuit 5 supplies the low-level voltage VSS and the high-level voltage VDD to the control circuits. As shown in FIG. 4c, the low-level voltage VSS is inputted to the switch transistor T5 through a power supply terminal BB, the high-level voltage VDD is inputted to the switch transistor T6 through a power supply terminal AA, the low-level voltage VSS is inputted to the fifth switch transistor T5 through a power supply terminal DD, and the high-level voltage VDD is inputted to the switch transistor T6 through the power supply terminal CC.

The description of other structures such as the edge signal terminal, the connection structure, and the wiring region in the embodiment is the same as that in the foregoing embodiment, and is not repeated herein.

According to the structure of the control circuit in the embodiment, the display panel including the display substrate in the embodiment may be a TFT-LCD display panel, because the pixel voltage of the TFT-LCD display panel generally has a positive or negative level. The TFT-LCD display panel is generally implemented by using an NMOS process. In the case where the display panel is a TFT-LCD display panel, the display substrate may be an array substrate.

Alternatively, in an embodiment, the second control circuit 42 in the pixel signal region may also employ the second control circuit 42 as shown in FIG. 2a.

Alternatively, in an embodiment, the second control circuit 42 in the pixel signal region may also employ the second control circuit 42 as shown in FIG. 3a.

Figure 5A:
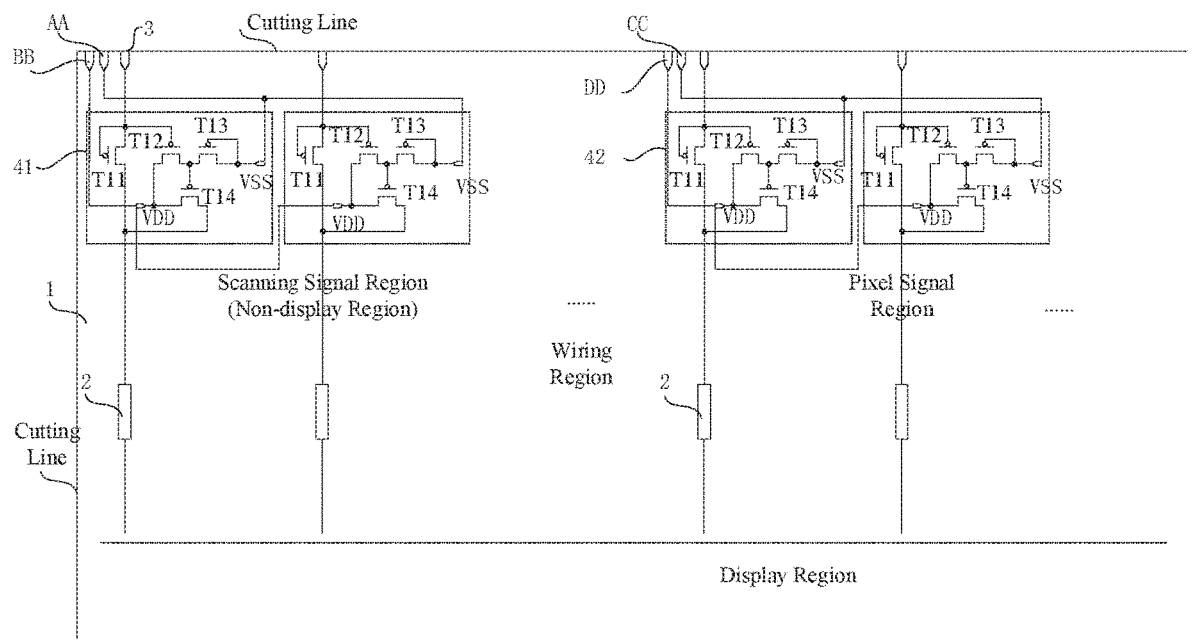
FIG. 5a is a schematic diagram showing a structure of a display substrate according to an embodiment of the present disclosure.
Figure 5B:
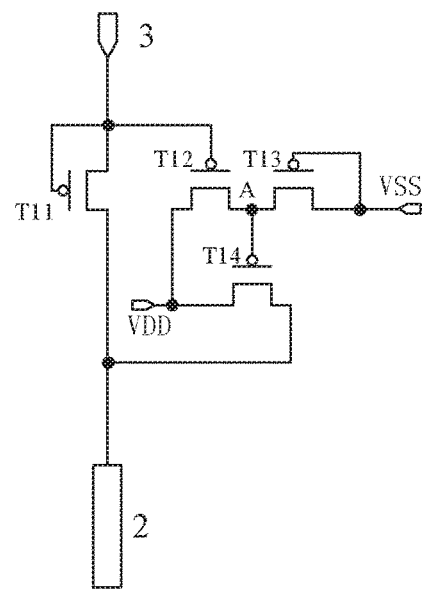
Figure 5C:
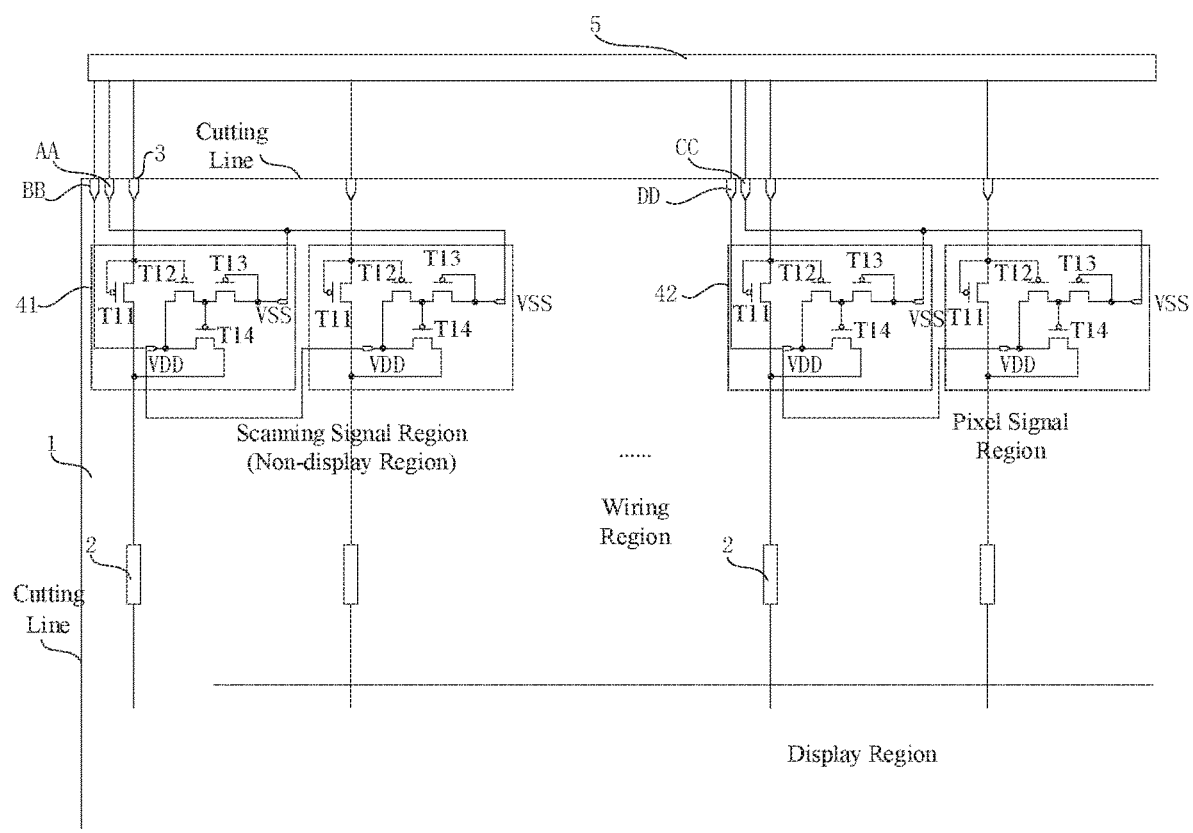
FIG. 5c is a schematic diagram showing a display substrate during a test stage according to an embodiment of the present disclosure.
Figure 5D:
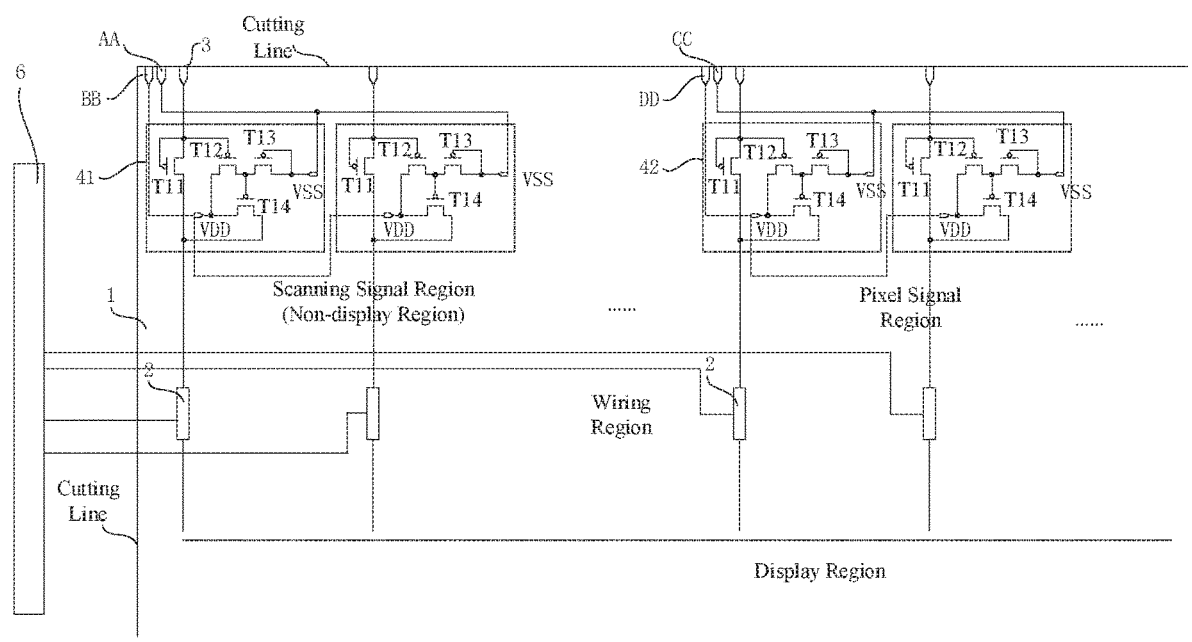
FIG. 5d is a schematic diagram showing a display substrate during a display stage according to an embodiment of the present disclosure.

FIG. 5a is a schematic diagram showing a structure of a display substrate according to an embodiment of the present disclosure. FIG. 5b is an enlarged view of the control circuit in FIG. 5a. FIG. 5c is a schematic diagram showing a display substrate during a test stage according to an embodiment of the present disclosure. FIG. 5d is a schematic diagram showing a display substrate during a display stage according to an embodiment of the present disclosure. As shown in FIGS. 5a, 5b, 5c and 5d, the plurality of first control circuits 41 in the GOA scanning signal region have the same structure as the structure of the plurality of second control circuits 42 in the pixel signal region.

Specifically, as shown in FIG. 5b, each of the control circuits may include an eleventh switch transistor T11, a twelfth switch transistor T12, a thirteenth switch transistor T13 and a fourteenth switch transistor T14 all of which are P-type MOS transistors.

A control electrode and a first electrode of the eleventh switch transistor T11 are coupled to a control electrode of the twelfth switch transistor T12 and coupled together to an edge signal terminal 3 coupled to the control circuit in which the eleventh switch transistor T11 and the twelfth switch transistor T12 are located. A second electrode of the eleventh switch transistor T11 and a second electrode of the fourteenth switch transistor T14 are coupled together and coupled to a connection structure 2 coupled to the control circuit in which the eleventh switch transistor T11 and the fourteenth switch transistor T14 are located. A first electrode of the twelfth switch transistor T12 is coupled to the high-level voltage VDD, and a second electrode of the twelfth switch transistor T12 is coupled to a first electrode of the thirteenth switch transistor T13 and a control electrode of the fourteenth switch transistor T14, respectively. A control electrode and a second electrode of the thirteenth switch transistor T13 are coupled together and coupled together to the low-level voltage VSS. A first electrode of the fourteenth switch transistor T14 is coupled to the high-level voltage VDD.

When the CK signal, the CB signal, or the data voltage signal having a low level is input to the first edge signal terminal 3, the eleventh switch transistor T11 is turned on, the first connection structure 2 receives the low-level signal, and the twelfth switch transistor T12 is turned on. The low-level voltage VSS has a low level all the time, and the high-level voltage VDD has a high level all the time. In this case, the thirteenth switch transistor T13 is turned on, so that a potential at the node A is in a range from 0 to 1. The fourteenth switch transistor T14 is turned off due to the potential at the node A, and the first connection structure 2 receives a low-level signal.

When the CK signal, the CB signal, or the data voltage signal having the high level is input to the first edge signal terminal 3, the eleventh switch transistor T11 is turned off, and the twelfth switch transistor T12 is turned off. Since the low-level voltage VSS has a low level, the thirteenth switch transistor T13 is turned on, so that the node A has a low level. The fourteenth switch transistor T14 is turned on, and the high-level voltage VDD is output to the first connection structure 2.

As can be seen from the above analysis, regardless of whether the CK signal, the CB signal, or the data voltage signal is a high-level signal or low-level signal, the plurality of control circuits 41 for receiving the CK signal and the CB signal in the GOA scanning signal region can be turned on, and the plurality of control circuits 42 for receiving the data voltage signals D1 and D2 in the pixel signal region can be turned on.

In the embodiment, each of the plurality of connection structures is coupled to a corresponding edge signal terminal through the control circuit 41 or 42, and the plurality of edge signal terminals are located on an edge of the wiring region. All of the control circuits 41 and 42 are turned on during the test stage, so that the test signals output from the edge signal terminals are output to the plurality of connection structures, respectively. All of the plurality of control circuits 41 and 42 are turned off during the display stage, so that the plurality of the connection structures are disconnected from the plurality of edge signal terminals. When some of the edge signal terminals are short-circuited, display signals loaded on the connection structures corresponding to some of the edge signal terminals cannot be affected, and therefore the display device is prevented from poor display.

According to the embodiment, as shown in FIG. 5c, the test circuit 5 respectively supplies the low-level voltage VSS and the high-level voltage VDD to the control circuits 41 and 42 during the test stage, in addition to the CK signal, the CB signal, and the data voltage signals D1 and D2.

The description of other structures such as the edge signal terminal, the connection structure, and the wiring region in the embodiment is the same as that in the foregoing embodiment, and is not repeated herein.

According to the structure of the control circuit in the embodiment, the display panel including the display substrate in the embodiment may be an AMOLED display panel, because the AMOLED display panel is generally implemented by using a PMOS process. In the case where the display panel is an AMOLED display panel, the display substrate may be an AMOLED display substrate.

Alternatively, in an embodiment, the second control circuit 42 in the pixel signal region may also employ the second control circuit 42 as shown in FIG. 2a.

Alternatively, in an embodiment, the second control circuit 42 in the pixel signal region may also employ the second control circuit 42 as shown in FIG. 3a.

According to the inventive concept of the present disclosure, the structure of the first control circuit in the GOA scanning signal region and the structure of the second control circuit in the pixel signal region are not limited thereto, as long as a plurality of control signals having positive and negative levels can be output to the corresponding connection structures through the first control circuits respectively, and a plurality of data voltage signals having positive levels, negative levels, or positive or negative levels can be output to the corresponding connection structures through the second control circuits respectively. Those skilled in the art can realize the equivalents, and all of the equivalents are within the scope of the present application.

In addition, the combination of the first control circuit and the second control circuit is not limited to the embodiments in the present disclosure, and a person skilled in the art may change the combination of the first control circuit and the second control circuit according to design. For example, in the case where the first control circuit employs the first control circuit 41 shown in FIG. 2a, the second control circuit may also employ the second control circuit 42 shown in FIG. 4b or 5b.

Figure 6:
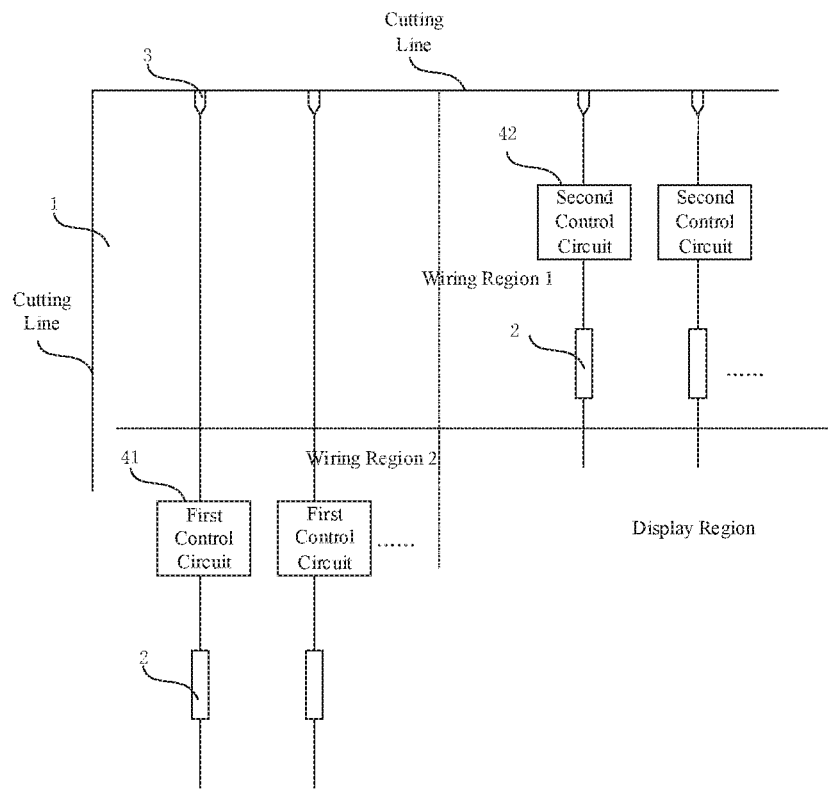
FIG. 6 is a schematic diagram showing an arrangement in a wiring region according to an embodiment of the present disclosure.

Alternatively, in an embodiment, the display substrate may be provided with only two wiring regions, i.e., a wiring region 1 and a wiring region 2. As shown in FIG. 6, the wiring region 1 and the wiring region 2 may be disposed on both edges on an upper and left sides of the display substrate outside the display region. The arrangement of the wiring regions in the present disclosure is not limited thereto, and those skilled in the art can set the number and positions of the wiring region according to design requirements.

A display panel including a display substrate and a counter substrate that are oppositely disposed is provided in an embodiment. The display substrate may be the display substrate provided in any one of the above embodiments.

The display panel may be an AMOLED display panel or a TFT-LCD display panel. In the case where the display panel is an AMOLED display panel, the display substrate may be an AMOLED display substrate, and the counter substrate is a protective substrate. In the case where the display panel is a TFT-LCD display panel, the display substrate may be an array substrate, and the counter substrate may be a color filter substrate.

A display device is provided in an embodiments. The display device includes any one of the AMOLED display panel and the TFT-LCD display panel as described above.

Further, the display device further includes a driving circuit for outputting a display signal to the display panel during the display stage.

A display motherboard is provided in an embodiment of the present disclosure. The display motherboard includes a plurality of display substrates arranged in an array as described above. The plurality of signal terminals of each of the display substrates are respectively connected to corresponding test signal input lines (for example, the test signal input lines arranged between the display substrates on the display motherboard).

Figure 7:
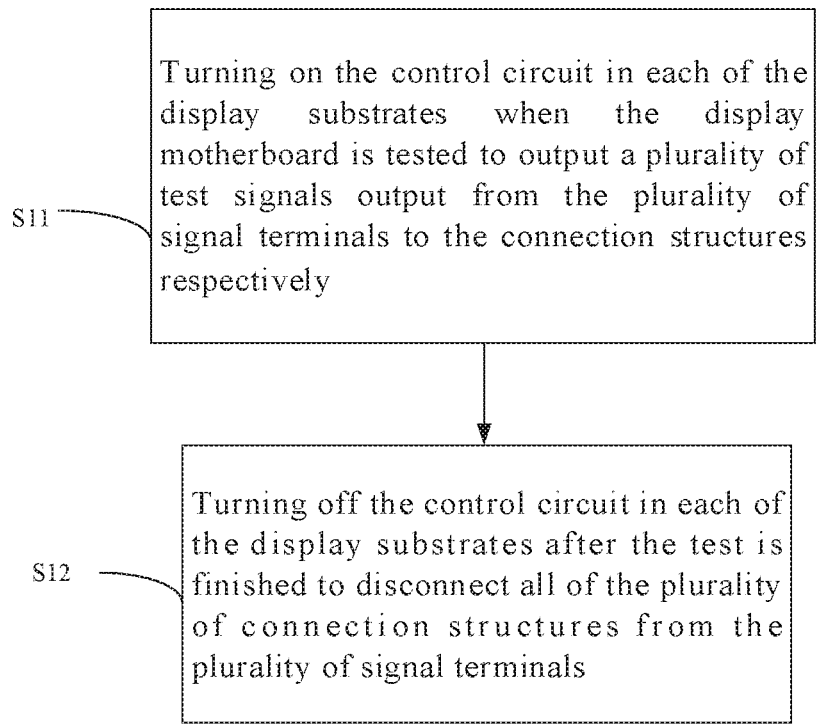
FIG. 7 is a flowchart of a method for testing a display motherboard according to an embodiment of the present disclosure.

FIG. 7 is a flowchart of a method for testing a display motherboard according to an embodiment of the present disclosure. As shown in FIG. 7, the test method includes steps S11 and S12.

At step S11, when the display motherboard is tested, the control circuits of the display substrates are turned on, so that the test signals output from the signal terminals are output to the connection structures, respectively.

At step S12, after the test is completed, the control circuits of each display substrate are turned off, so that the connection structures are disconnected from the signal terminals respectively.

Figure 8:
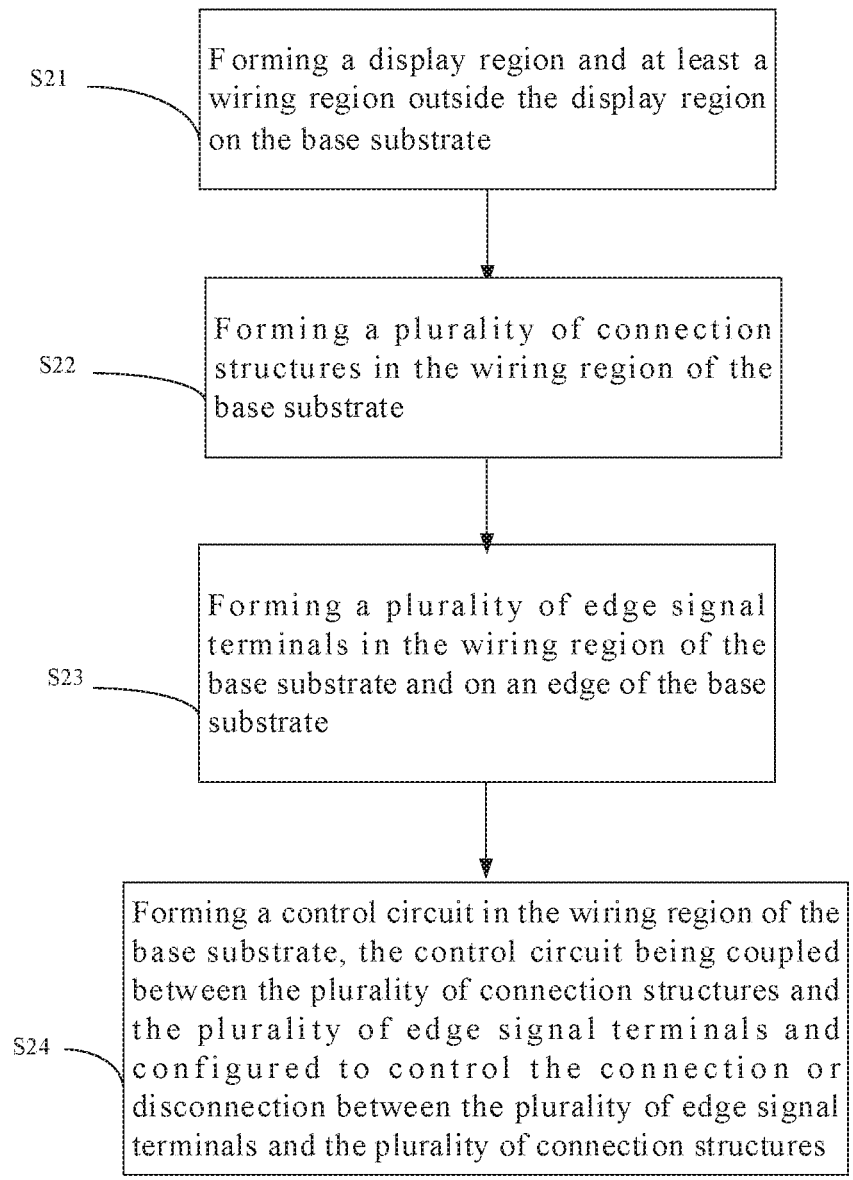
FIG. 8 is a flowchart of a method for manufacturing a display substrate according to an embodiment of the present disclosure.

FIG. 8 is a flowchart of a method for manufacturing a display substrate according to an embodiment of the present disclosure. As shown in FIGS. 1a and 8, the method for manufacturing the display substrate includes steps S21 to S24.

At step S21, a display region and at least a wiring region outside the display region are formed on the base substrate 1.

At step S22, a plurality of connection structures 2 are formed in the wiring region of the base substrate 1.

At step S23, a plurality of edge signal terminals 3 are formed in the wiring region of the base substrate 1 and on an edge of the base substrate.

At step S24, a control circuit is formed in the wiring region of the base substrate 1. The control circuit is coupled between the plurality of connection structures 2 and the plurality of edge signal terminals 3. The control circuit controls the connection or disconnection between the plurality of edge signal terminals 3 and the plurality of connection structures 2.

According to the display panel, the display motherboard and the display device provided by the embodiment, the plurality of connection structures are connected with the plurality of edge signal terminals through the control circuits, and the plurality of edge signal terminals are located at the cutting line in the wiring region. The control circuit can be turned on during the test stage, so that the testing signals output by the edge signal terminals are output to the connection structures respectively. The control circuit can be turned off after the test is finished, so that the connection structures are disconnected from the corresponding edge signal terminals. Therefore, when a short circuit occurs at the edge signal terminal, the display signals loaded on different connection structures cannot be affected, and therefore the display device is prevented from poor display during display.

It is to be understood that the above embodiments are merely exemplary embodiments for explaining the principles of the present disclosure, and the present disclosure is not limited thereto. It will be apparent to one of ordinary skill in the art that various changes and modifications may be made therein without departing from the spirit and essence of the present disclosure, and these changes and modifications also fall within the scope of the present disclosure.

What is claimed is:

1. A display substrate, provided with a display region and at least a wiring region outside the display region;
   wherein the display substrate comprises:
   a base substrate,
   a plurality of connection structures, on the base substrate and in the wiring region,
   a plurality of signal terminals, on the base substrate and on an edge of the wiring region,
   a control circuit, coupled between the plurality of connection structures and the plurality of signal terminals, disposed in the wiring region, and configured to control connection or disconnection between the plurality of signal terminals and the plurality of connection structures,
   wherein the control circuit comprises a plurality of first control circuits and a plurality of second control circuits, and each of the plurality of first control circuits and the plurality of second control circuits has a terminal connected to a corresponding one of the plurality of signal terminals and the other terminal connected to a corresponding one of the plurality of connection structures,
   each of the plurality of first control circuits comprises a first switch transistor and a second switch transistor which have different types from each other,
   a control electrode and a first electrode of the first switch transistor are coupled to a control electrode and a first electrode of the second switch transistor and are coupled to a signal terminal coupled to a control circuit in which the first switch transistor and the second switch transistor are located, and
   a second electrode of the first switch transistor is coupled to a second electrode of the second switch transistor and is coupled to a connection structure coupled to the control circuit in which the first switch transistor and the second switch transistor are located.

2. The display substrate according to claim 1, wherein each of the plurality of first control circuits is configured to receive a control signal from a signal terminal connected with the first control circuit during a test stage, and each of the plurality of second control circuits is configured to receive a data voltage signal from a signal terminal connected with the second control circuit during the test stage.

3. The display substrate according to claim 1, wherein
   at least one of the plurality of second control circuits comprises a first switch transistor and a second switch transistor which have different types from each other,
   a control electrode and a first electrode of the first switch transistor are coupled to a control electrode and a first electrode of the second switch transistor and are coupled to a signal terminal coupled to a control circuit in which the first switch transistor and the second switch transistor are located, and
   a second electrode of the first switch transistor is coupled to a second electrode of the second switch transistor and is coupled to a connection structure coupled to the control circuit in which the first switch transistor and the second switch transistor are located.

4. The display substrate according to claim 1, wherein
   at least one of the plurality of second control circuits comprises a third switch transistor,
   a control electrode and a first electrode of the third switch transistor are coupled together and are coupled to a signal terminal coupled to a control circuit in which the third switch transistor is located, and
   a second electrode of the third switch transistor is coupled to a connection structure coupled to the control circuit in which the third switch transistor is located.

5. The display substrate according to claim 1, wherein
   at least one of the plurality of second control circuits comprises a fourth switch transistor, a fifth switch transistor, a sixth switch transistor and a seventh switch transistor,
   a control electrode and a first electrode of the fourth switch transistor are coupled to a control electrode of the fifth switch transistor and are coupled to a signal terminal coupled to a control circuit in which the fourth switch transistor and the fifth switch transistor are located,
   a second electrode of the fourth switch transistor and a second electrode of the seventh switch transistor are coupled together and are coupled to a connection structure coupled to the control circuit in which the fourth switch transistor and the seventh switch transistor are located,
   a first electrode of the fifth switch transistor is coupled to a first power supply terminal, and a second electrode of the fifth switch transistor is coupled to a first electrode of the sixth switch transistor and a control electrode of the seventh switch transistor respectively,
   a control electrode and a second electrode of the sixth switch transistor are coupled together to a second power supply terminal, and
   a first electrode of the seventh switch transistor is coupled to the first power supply terminal.

6. The display substrate according to claim 1, wherein each of the plurality of connection structures is a pad.

7. The display substrate according to claim 1, wherein the display substrate comprises one wiring region on one edge of the display substrate outside the display region.

8. A display panel comprising a counter substrate and a display substrate disposed opposite to each other, wherein the display substrate is the display substrate according to claim 1.

9. The display panel according to claim 8, wherein the display panel comprises a liquid crystal display panel or an AMOLED display panel.

10. A display device comprising the display panel according to claim 8.

11. A display motherboard comprising a plurality of display substrates arranged in an array, wherein each of plurality of display substrates is the display substrate according to claim 1.

12. A method for testing the display motherboard according to claim 11, comprising:
    turning on the control circuit in each of the display substrates when the display motherboard is tested to output a plurality of test signals output from the plurality of signal terminals to the plurality of connection structures; and turning off the control circuit in each of the display substrates after the test is finished to disconnect all of the plurality of connection structures from the plurality of signal terminals.

13. A display substrate, provided with a display region and at least a wiring region outside the display region;
wherein the display substrate comprises:
a base substrate,
a plurality of connection structures, on the base substrate and on an edge of the wiring region,
a plurality of signal terminals, on the base substrate and on an edge of the wiring region,
a control circuit, coupled between the plurality of connection structures and the plurality of signal terminals, disposed in the wiring region, and configured to control connection or disconnection between the plurality of signal terminals and the plurality of connection structures,
wherein the control circuit comprises a plurality of first control circuits and a plurality of second control circuits, and each of the plurality of first control circuits and the plurality of terminals and the other terminal connected to a corresponding one of the plurality of connection structures,
each of the plurality of first control circuits comprises a fourth switch transistor, a fifth switch transistor, a sixth switch transistor and a seventh switch transistor,
a control electrode and a first electrode of the fourth switch transistor are coupled to a control electrode of the fifth switch transistor and are coupled to a signal terminal coupled to a control circuit in which the fourth switch transistor and the fifth switch transistor are located,
a second electrode of the fourth switch transistor and a second electrode of the seventh switch transistor are coupled together and are coupled to a connection structure coupled to the control circuit in which the fourth switch transistor and the seventh switch transistor are located,
a first electrode of the fifth switch transistor is coupled to a first power supply terminal, and a second electrode of the fifth switch transistor is coupled to a first electrode of the sixth switch transistor and a control electrode of the seventh switch transistor respectively,
a control electrode and a second electrode of the sixth switch transistor are coupled together to a second power supply terminal, and
a first electrode of the seventh switch transistor is coupled to the first power supply terminal.

14. The display substrate according to claim 13, wherein at least one of the plurality of second control circuits comprises a first switch transistor and a second switch transistor which have different types from each other,
a control electrode and a first electrode of the first switch transistor are coupled to a control electrode and a first electrode of the second switch transistor and are coupled to a signal terminal coupled to a control circuit in which the first switch transistor and the second switch transistor are located, and
a second electrode of the first switch transistor is coupled to a second electrode of the second switch transistor and is coupled to a connection structure coupled to the control circuit in which the first switch transistor and the second switch transistor are located.

15. The display substrate according to claim 13, wherein at least one of the plurality of second control circuits comprises a third switch transistor, a control electrode and a first electrode of the third switch transistor are coupled together and are coupled to a signal terminal coupled to a control circuit in which the third switch transistor is located, and
a second electrode of the third switch transistor is coupled to a connection structure coupled to the control circuit in which the third switch transistor is located.

16. The display substrate according to claim 13, wherein at least one of the plurality of second control circuits comprises a fourth switch transistor, a fifth switch transistor, a sixth switch transistor and a seventh switch transistor,
a control electrode and a first electrode of the fourth switch transistor are coupled to a control electrode of the fifth switch transistor and are coupled to a signal terminal coupled to a control circuit in which the fourth switch transistor and the fifth switch transistor are located,
a second electrode of the fourth switch transistor and a second electrode of the seventh switch transistor are coupled together and coupled to a connection structure coupled to the control circuit in which the fourth switch transistor and the seventh switch transistor are located,
a first electrode of the fifth switch transistor is coupled to a first power supply terminal, and a second electrode of the fifth switch transistor is coupled to a first electrode of the sixth switch transistor and a control electrode of the seventh switch transistor respectively,
a control electrode and a second electrode of the sixth switch transistor are coupled together to a second power supply terminal, and
a first electrode of the seventh switch transistor is coupled to the first power supply terminal.

17. A method for manufacturing a display substrate, comprising:
forming a display region and at least a wiring region outside the display region on a base substrate;
forming a plurality of connection structures in the wiring region of the base substrate;
forming a plurality of signal terminals in the wiring region of the base substrate and on an edge of the base substrate; and
forming a control circuit coupled between the plurality of connection structures and the plurality of signal terminals in the wiring region of the base substrate,
wherein the control circuit controls connection or disconnection between the plurality of signal terminals and the plurality of connection structures,
forming the control circuit comprises: forming the control circuit such that:
the control circuit comprises a plurality of first control circuits and a plurality of second control circuits, and each of the plurality of first control circuits and the plurality of second control circuits has a terminal connected to a corresponding one of the plurality of signal terminals and the other terminal connected to a corresponding one of the plurality of connection structures,
each of the plurality of first control circuits comprises a first switch transistor and a second switch transistor which have different types from each other,
a control electrode and a first electrode of the first switch transistor are coupled to a control electrode and a first electrode of the second switch transistor and are coupled to a signal terminal coupled to a control circuit in which the first switch transistor and the second switch transistor are located, and a second electrode of the first switch transistor is coupled to a second electrode of the second switch transistor and is coupled to a connection structure coupled to the control circuit in which the first switch transistor and the second switch transistor are located.

* * * * *